United States Patent [19]

Martin

[11] Patent Number: 4,974,119
[45] Date of Patent: Nov. 27, 1990

[54] CONFORMING HEAT SINK ASSEMBLY

[75] Inventor: Jacob H. Martin, Wellesley, Mass.

[73] Assignee: The Charles Stark Draper Laboratories, Inc., Cambridge, Mass.

[21] Appl. No.: 533,957

[22] Filed: May 29, 1990

Related U.S. Application Data

[63] Continuation of Ser. No. 247,241, Sep. 14, 1988, abandoned.

[51] Int. Cl.$^5$ ............................................. H05K 7/20
[52] U.S. Cl. .................................. 361/386; 165/185; 361/388
[58] Field of Search ................. 357/81; 174/16.3, 252; 165/80.3, 185; 361/386, 387, 388, 400, 405, 410

[56] References Cited

U.S. PATENT DOCUMENTS 4,151,547  4/1979  Rhoades .............................. 361/387
4,654,754  3/1987  Daszkowski ...................... 165/185

OTHER PUBLICATIONS

IBM Tech Discl Bull, vol. 28, No. 6, 11/85, Heat Sink-Air-Laminar Bus, pp. 2608, 2609.
IBM Tech Discl Bull, vol. 21, No. 4, 9/78, Module—Resistance, Arnold et al, pp. 1473, 1474.

*Primary Examiner*—Gerald P. Tolin
*Attorney, Agent, or Firm*—Joseph S. Iandiorio; Brian M. Dingman

[57] ABSTRACT

A conforming heat sink assembly including a heat dispersive element is mounted in spaced relationship to a surface from which heat is to be conducted. A thermal interface is provided for coupling the heat dispersive element to the surface from which heat is to be conducted. The thermal interface includes an elastomeric member which occupies only a portion of a volume defined by mounting the heat dispersive element proximate the surface from which heat is to be conducted. The unoccupied volume allows the elastomeric member to easily conform to the irregular surface from which heat is to be conducted to enhance thermal conductivity from the surface to the heat dispersive member.

28 Claims, 4 Drawing Sheets

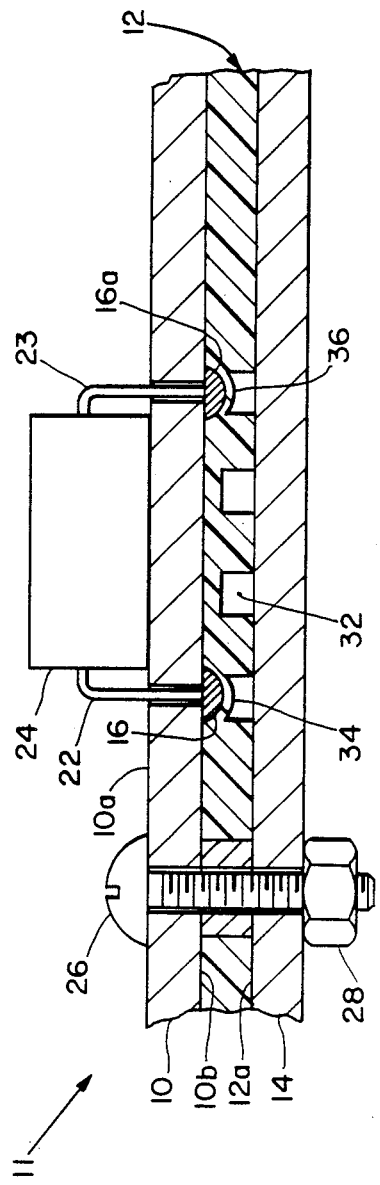
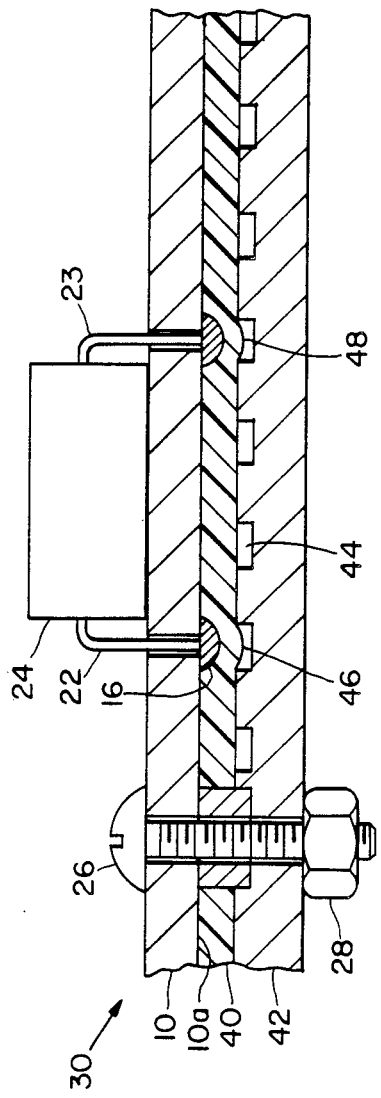

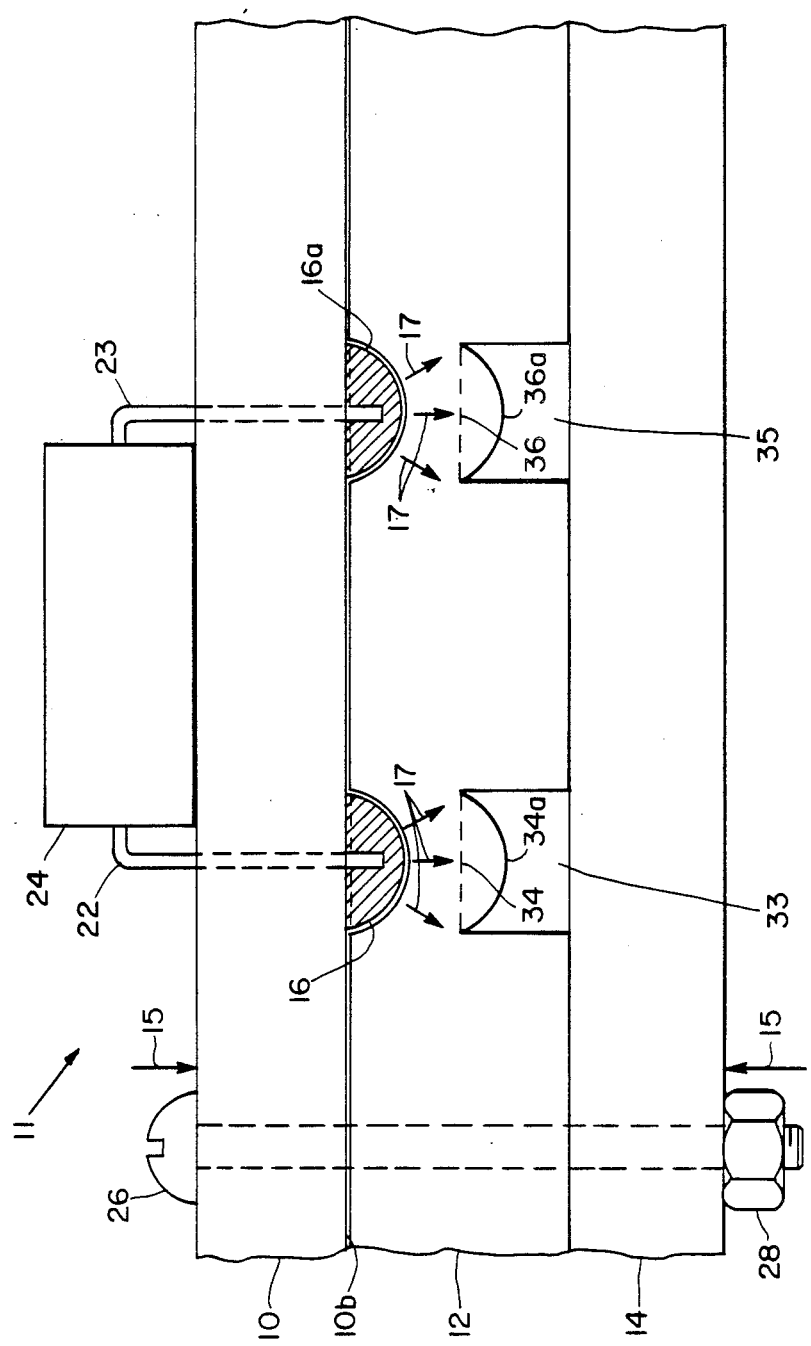

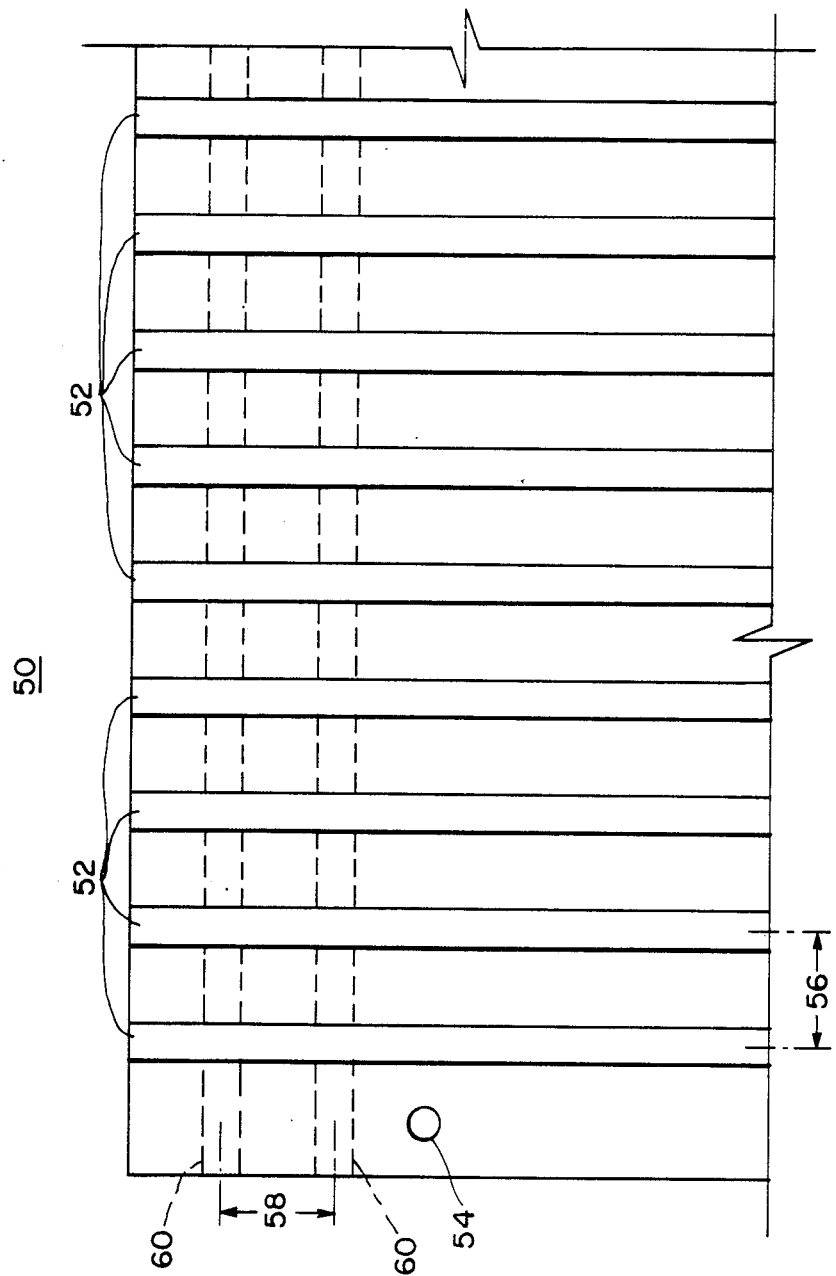

CONFORMING HEAT SINK ASSEMBLY

This is a continuation of application Serial No. 07/247,241, filed Sept. 14, 1988, now abandoned.

FIELD OF INVENTION

This invention relates to an improved conforming heat sink assembly for removing heat from a heat source and, more particularly, to such an assembly which conforms to an irregular surface, such as a printed circuit board, from which heat is to be removed.

BACKGROUND OF INVENTION

Modern integrated circuits have become increasingly complex, to a point where they now contain the equivalent of several hundred thousand transistors. The increased heat generated by these advanced integrated circuits must be efficiently removed in order to keep them from suffering a high failure rate caused by high temperature operation.

Particularly troublesome is the problem of transferring heat from semiconductor devices and other heat generating devices which are mounted to a substrate such as a printed circuit board. Since printed circuit boards are by their very nature poor conductors of heat, the devices must be cooled using additional means such as a fan or a heat sink placed on or near the heat generating device. It is difficult, however, to place a heat sink on or near a device which itself establishes a highly irregular surface. Additionally, cooling requirements are rendered more difficult by improvements in component packaging densities, as well as increased use of integrated circuits in environments where extreme temperatures and mechanical packaging difficulties exist, such as in aerospace electronics. Improvements to resolve these thermal and mechanical difficulties would allow larger printed circuit board modules, reduce system size and temperatures, and thereby improve system reliability.

In many applications, designers of printed circuit boards simply rely on the copper traces, ground plane, and power plane located in the printed circuit board to transfer the heat. The addition of copper planes or metal cores to the printed circuit board is also used. However, reliance on the copper in the printed circuit board is only satisfactory when heat generation of the electronic devices and ambient environmental temperatures are low, so that these poorer thermal paths can be tolerated. Moreover, the addition of copper planes or metal cores to the printed circuit board increases the cost and complexity of the board.

Another method of transferring the heat from the components is to laminate a heat sink to the printed circuit board. Laminating a heat sink to the component side of a printed circuit board requires cutouts in the heat sink to accommodate the component leads. The heat sink with cutouts is then laminated to the component side surface of the printed circuit board. The component leads are then inserted into the circuit board and the body may be cemented to the heat sink. Much heat sink efficiency is lost due to the cutouts and, in addition, component leads may not be long enough to protrude through the solder side of the circuit board because the components are raised above the board by the thickness of the heat sink. Additionally, the increased use of components utilizing the leaded array package, whose leads may occupy nearly all the surface area under component, makes it impossible to provide a continuous heat sink under the component. These packages need adequate heat sinking the most, since they are, by nature, large and tend to be heat generating devices.

Lamination of a heat sink to the back of a printed circuit board has previously been limited to printed circuit boards with surface mounted components whose leads by definition do not protrude through the backside of the board or if attempted with through-the-board components, would be characterized as nearly ineffective. Thermal contact of the heat sink with the back of the printed circuit board is limited, at best, due to the irregular surface formed by the component leads protruding through the back of the board.

SUMMARY OF INVENTION

It is therefore an object of this invention to provide an improved heat sink assembly for mounting to a device to be cooled in order to transfer heat from the device to the heat sink assembly.

It is a further object of this invention to provide an improved heat sink assembly for transferring heat from a heat source with an irregular surface to the heat sink assembly.

It is a further object of this invention to provide such an assembly which can be deformed by an irregular surface to enhance thermal conductivity between the irregular surface and a heat sink.

Yet another object of this invention to provide a heat sink assembly for a printed circuit board which provides structural rigidity to the board while at the same time providing vibration dampening.

This invention results from the realization that a truly effective heat sink assembly can be achieved by providing an elastomeric member between a surface from which heat is to be conducted and a heat dispersive member, and by establishing, in either the elastomeric member or the heat dispersive member, a plurality of voids to allow the elastomeric member to conform to the irregularities of the surface from which heat is to be conducted, thereby increasing contact between the surface and the heat dispersive member and enhancing thermal conductivity to the heat dispersive member.

This invention features a heat sink assembly for conducting heat away from an irregular surface. Included are a heat dispersing member and an elastomeric member disposed between the heat dispersing member and the irregular surface to physically contact the heat dispersing member and the irregular surface. At least one of the heat dispersing member and the elastomeric member defines a plurality of voids to enable the elastomeric member to be displaced into the voids by the irregular surface to increase the amount of surface area of the elastomeric member that is in contact with irregular surface and thereby enhance thermal conductivity from the irregular surface to the heat dispersing member.

In one embodiment, the elastomeric member is thermally conductive and electrically insulative, and the voids are established by periodic channels or holes. In an alternative embodiment, the elastomeric member exhibits a periodic undulating shape.

This invention also features a heat sink assembly for mounting to a device to be cooled, including a heat dispersing member and means for mounting the heat dispersing member in spaced relationship to the device to be cooled. The means for mounting establishes a clamping force between the heat dispersing member and the device to be cooled. Mounting the heat dispersing member in spaced relationship to the device to be cooled establishes a first volume in which is disposed an elastomeric, thermally conductive member which occupies only a portion of the volume to enable the elastomeric member to be deformed and displaced by the device to be cooled to relieve stress generated by the clamping force of the means for mounting between the heat dispersing member and the device to be cooled.

In a preferred embodiment, the elastomeric member is electrically insulative and includes a silicone material. The elastomeric member also contains a thermally conductive filler selected from the group including boron nitride, aluminum oxide, silicon carbide, aluminum nitride, magnesium oxide, and beryllium oxide.

The elastomeric member defines a plurality of voids which are located on a face of the elastomeric member. The voids are established by periodic channels extending substantially in a first direction and generally parallel in a second direction transverse to the first direction.

In an alternative embodiment, the voids may further include a second arrangement of periodic channels which extend substantially in the second direction and are generally parallel in the first direction. The voids are preferably disposed on a surface of the elastomeric member opposite the device to be cooled. In an alternative embodiment, the elastomeric member exhibits a periodic undulating shape.

In yet another alternative embodiment, the heat dispersing member may define a plurality of voids which are located on the surface of the heat dispersing member and which are established by periodic channels extending substantially in a first direction and generally parallel in a second direction transverse to the first direction.

This invention further features a thermal interface for coupling a heat dispersing element to an irregular surface from which heat is to be conducted. The thermal interface includes a thermally conductive and electrically insulative elastomeric member disposed between the irregular surface and the heat dispersing element, and a plurality of recesses defined by the elastomeric member to enable the elastomeric member to be displaced into the recesses by the irregular surface to increase the amount of surface area of the elastomeric member that is in contact with the irregular surface to enhance thermal conductivity from the irregular surface to the heat dispersing member.

In a preferred embodiment, the elastomeric member includes a silicone material as well as a thermally conductive filler selected from the group including boron nitride, aluminum oxide, silicon carbide, aluminum nitride, magnesium oxide, and beryllium oxide. In addition, the recesses are established by periodic channels. In an alternative embodiment, the recesses are established by periodic undulations in the elastomeric member.

This invention also features a heat sink assembly for a printed circuit board having a first surface including at least one heat generating source, and a second, irregular surface having a plurality of irregularities and from which heat is to be conducted. Also included are a heat dispersive member and means for mounting the heat dispersive member proximate the second surface of the printed circuit board. Disposed between the second surface and the heat dispersive member is an elastomeric member. At least one of the heat dispersive member and the elastomeric member defines a plurality of voids to enable the elastomeric member to be deformed by the irregularities and conform to the irregular surface to increase the amount of surface area of the elastomeric member that is in contact with the irregular surface, and thereby enhance thermal conductivity from the irregular surface to the heat dispersive member.

In a preferred embodiment, the heat generating source includes at least one electronic component and the irregularities of the second surface include a plurality of leads of electronic components. In addition, the plurality of voids in the elastomeric member are recesses which are established by periodic channels. The elastomeric member is electrically insulative and thermally conductive, and includes a silicone material and a thermally conductive filler from the group consisting of boron nitride, aluminum oxide, silicon carbide, aluminum nitride, magnesium oxide, and beryllium oxide.

DISCLOSURE OF PREFERRED EMBODIMENTS

Other objects, features, and advantages will occur from the following description of preferred embodiments and the accompanying drawing, in which:

FIG. 1 is an elevational, cross-sectional view of a printed circuit board with a heat sink assembly according to this invention;

FIG. 2 is an enlarged elevational, cross-sectional view of a portion of a printed circuit board with a heat sink assembly in FIG. 1, showing an elastomeric member with a number of recesses;

FIG. 3 is a top plan view of an elastomeric member according to this invention with periodic recesses;

FIG. 4 is an elevational, cross-sectional view of a printed circuit board with a heat sink assembly according to this invention, showing a heat dispersive member having a plurality of recesses.

Figure 5:
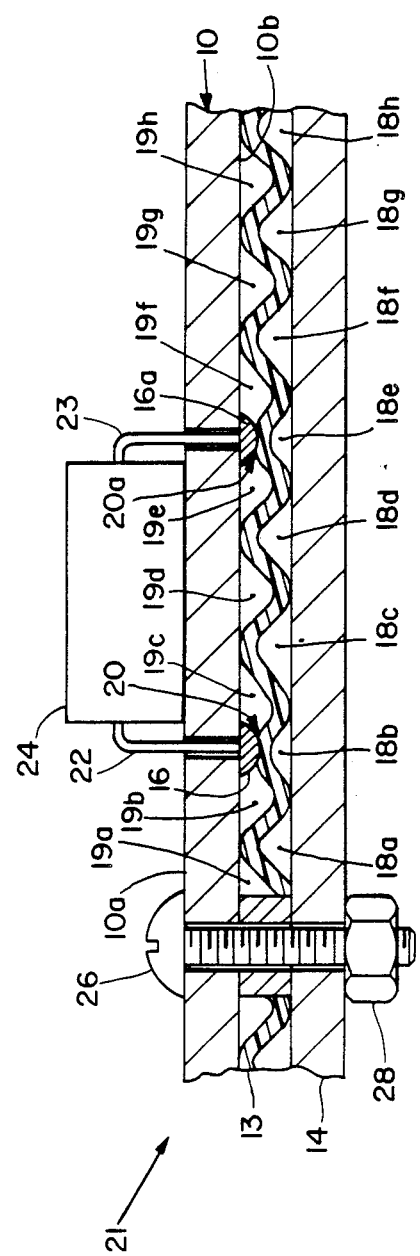
FIG. 5 is an elevational, cross-sectional view of a printed circuit board with a heat sink assembly according to this invention showing an elastomeric member having periodic undulations.

A conforming heat sink assembly according to this invention may be accomplished by providing an elastomeric member and a heat dispersive member which in combination enable deformation of the elastomeric member. The conforming heat sink assembly is particularly well suited for use with any irregular surface from which heat is to be conducted. The heat dispersive member is mounted in spaced relationship to the surface from which heat is to be conducted. The elastomeric member is located between the heat dispersive member and the surface from which heat is to be conducted.

The elastomeric member is preferably thermally conductive yet electrically insulative. The elastomeric member may be made of silicone and preferably contains a filler to make the member more thermally conductive. The filler should be thermally conductive, yet electrically insulative. An example of such an elastomeric material is COHRlastic$^R$ TC-100 manufactured by CHR Industries of New Haven, Conn., which employs aluminium oxide as the primary filler. Although the filler may be dispersed within the elastomer, the elastomer may include an electrically conductive layer laminated to a layer of electrically insulative elastomer. Various other fillers, such as boron nitride, silicon carbide, aluminum nitride, magnesium oxide, and beryllium oxide, may also be used. In addition to being thermally conductive and electrically insulative, the elastomeric member, once mounted in the heat sink assembly, contacts the surface from which heat is to be conducted and, through shear friction while under vibration, absorbs some of the vibration energy generated.

The heat dispersing member, the elastomer, or both elements defines voids which allow the elastomer to be deformed by the irregular surface when the heat dispersing member is mounted to the irregular surface. The voids may be recesses and, preferably, the recesses may be holes or periodic channels, spaced in at least one direction at predetermined intervals. Such intervals are typically in increments of 0.1 inch. This interval corresponds with the increment commonly used for component lead spacing yet provides for the greatest flexibility in allowing the component to be shifted anywhere along the periodic channel. Alternatively, periodic channels are provided in two directions, allowing even greater ease and flexibility of component placement on the printed circuit board. The irregular surface is typically formed by component leads protruding through the bottom of a printed circuit board. A large percentage of the heat generated by a component flows down the component lead which is the most direct thermal path to a heat-dispersing member. The recesses are typically located on the surface of either the heat dispersing member or the elastomeric member. If located on the elastomeric member, the surface containing the recesses is preferably disposed opposite the irregular surface to provide maximum contact between the elastomeric member and the irregular surface with the least amount of force, and thereby transfer the most heat to the heat-dispersive member. Additionally, the elastomeric member may be provided with an undulating or corrugated shape.

Conforming heat sink assembly 11 according to this invention, FIG. 1, includes printed circuit board 10, elastomeric member 12, and heat dispersive member 14. Mounted on first surface 10a of the printed circuit board 10 is electronic component 24 having leads 22 and 23 which protrude through the second surface 10b of circuit board 10 and are soldered in place, creating solder bumps 16 and irregular surface 10b from which heat is to be conducted.

Elastomeric member 12 is provided with a plurality of recesses in the form of periodic channels 32. Periodic channels 32 are located on surface 12a of elastomeric member 12, opposite irregular surface 10b which is formed by solder bumps 16 and 16a. Solder bumps 16 and 16a cause elastomeric member 12 to be deformed at points 34 and 36.

Mounting bolt 26 and nut 28 hold heat dispersive member 14 in spaced relationship with printed circuit board 10, as shown in the enlarged, partial view in FIG. 2. As mounting bolt 26 is tightened, force is exerted in the direction of arrow 15 to hold the assembly together. This force is transferred to circuit board 10, which causes solder bumps 16 and 16a to exert force at points 34, 36 in the direction of arrows 17, causing dashed lines 34, 36 to be deformed into voids 33, 35 as shown at 34a and 36a. Permitting elastomeric member 12 to be easily deformed at dashed lines 34 and 36 optimizes contact between circuit board 10 and elastomeric member 12, and keeps the remainder of printed circuit board 10 generally parallel with heat dispersive member 14, thereby improving heat transfer between circuit board 10 and heat dispersive member 14 and reducing the possibilities of printed circuit board 10 warping or distorting.

Elastomeric member 50, FIG. 3, includes periodic channels 52 arranged along one direction and having uniformly spaced intervals 56, which typically are an increment of 0.1 inches. In addition, periodic channels 60 may be provided on the same side in a perpendicular direction and have uniformly spaced intervals 58 of typically 0.1 inches. Elastomeric member 50 is provided with mounting holes 54, to facilitate mounting and alignment in the conforming heat sink assembly.

An alternative conforming heat sink assembly 30, FIG. 4, according to this invention includes solid elastomeric member 40, printed circuit board 10 and heat dispersive member 42. Heat dispersive member 42 defines periodic channels 44 which allow solder bumps 16 to deform elastomeric member 40 at points 46 and 48.

In an alternative construction, heat sink assembly 21, FIG. 5, includes elastomeric member 13 which is provided with an undulating or corrugated shape defining voids 18a–h and 19a–h. Elastomeric member 13 contacts solder bumps 16 and 16a at deformation points 20 and 20a. Mounting screw 26 and nut 28 hold heat dispersive member 14 in spaced relationship with printed circuit board 10 and force elastomeric member 13 against irregular surface 10b. Elastomeric member 13 conforms to irregular surface 10b by displacement into voids 18b and 18e, thereby optimizing contact between circuit board 10 and elastomeric member 13 which improves heat transfer between circuit board 10 and heat dispersive member 14, minimizing warpage of printed circuit board 10.

Although the irregular surface has been described above as a printed circuit board having one or more electronic components mounted on one surface with the leads of the components protruding through the second surface, this is not a limitation of the invention. A conforming heat sink assembly of this invention may be adapted to any device or surface from which heat is to be conducted.

Although specific features of the invention are shown in some drawings and not others, this is for convenience only, as each feature may be combined with any or all of the other features in accordance with this invention.

Other embodiments will occur to those skilled in the art and are within the following claims:

What is claimed is:

1. A heat sink assembly comprising:
   a heat dispersing member;
   an elastomeric member disposed between said heat dispersing member and an irregular surface to be cooled having protrusions, which physically contacts said heat dispersing member and said irregular surface;
   at least one of said heat dispersing member and said elastomeric member defining a plurality of voids at a junction thereof, each of said voids disposed along the junction between said elastomeric member and said heat dispersing member and said voids spaced with respect to each other and are aligned with same protrusions, to enable said protrusions to displace said elastomeric member into said voids, to increase the amount of surface area of said elastomeric member that is in contact with said irregular surface and enhance thermal conductivity from said irregular surface to said heat dispersing member.

2. The heat sink assembly of claim 1 in which said elastomeric member is thermally conductive and electrically insulative.

3. The heat sink assembly of claim 1 in which said voids are established by periodic channels or holes.

4. The heat sink assembly of claim 1 in which said elastomeric member exhibits a periodic undulating shape.

5. A heat sink assembly comprising:
a heat dispersing member;
means mounting said dispersing member in spaced relationship to a device to be cooled having protrusions, to establish a first volume between said heat dispersing member and the device and for establishing a clamping force; and
an elastomeric, thermally conductive member disposed in said first volume, at least one of said elastomeric member and said heat dispersing member defining a plurality of voids at a junction thereof, each of said voids disposed along the junction between said elastomeric member and said heat dispersing member and said voids spaced with respect to each other and are aligned with said protrusions, to enable said elastomeric member to be deformed and displaced by said protrusions into at least a portion of the unoccupied portion of said first volume to relieve stress generated by the clamping force of said means mounting between said heat dispersing member and said device to be cooled.

6. The heat sink assembly of claim 5 in which said elastomeric member is electrically insulative.

7. The heat sink assembly of claim 5 in which said elastomeric member includes a silicone material.

8. The heat sink assembly of claim 5 in which said elastomeric member contains one or more thermally conductive fillers.

9. The heat sink assembly of claim 8 in which said filler is selected from the group including boron nitride, aluminum oxide, silicon carbide, aluminum nitride, magnesium oxide, and beryllium oxide.

10. The heat sink assembly of claim 5 in which said elastomeric member defines a plurality of voids.

11. The heat sink assembly of claim 10 in which said voids are located on a surface of said elastomeric member.

12. The heat sink assembly of claim 11 in which said voids are established by a plurality of generally parallel channels which extend substantially in a first direction and are generally parallel in a second direction transverse to said first direction.

13. The heat sink assembly of claim 12 in which said voids are further established by a second plurality of channels which extend substantially in said second direction and are generally parallel in said first direction.

14. The heat sink assembly of claim 5 in which said elastomeric member exhibits a periodic undulating shape.

15. The heat sink assembly of claim 5 in which said heat dispersing member defines a plurality of voids.

16. The heat sink assembly of claim 15 in which said voids are located on the surface of said heat dispersing member.

17. The heat sink assembly of claim 15 in which said voids are established by a plurality of generally parallel.

18. A thermal interface comprising:
a thermally conductive and electrically insulative elastomeric member having first and second sides, a plurality of recesses defined by said elastomeric member on said first side, said elastomeric member disposed between an irregular surface to be cooled having protrusions and a heat dispersing member with said second side toward said irregular surface, said recesses spaced with respect to each other and are aligned with said protrusions, to enable said elastomeric member to be displaced into said recesses by said protrusions, to increase the surface area of said elastomeric member that is in contact with said irregular surface and enhance thermal conductivity from said irregular surface to said heat dispersing member.

19. The thermal interface of claim 18 in which said recesses are established by periodic channels or holes.

20. The thermal interface of claim 19 in which said recesses are established by periodic undulations.

21. The thermal interface of claim 18 in which said elastomeric member includes a silicone material.

22. The thermal interface of claim 18 in which said elastomeric member contains one or more thermally conductive fillers.

23. The thermal interface of claim 22 in which said filler is selected from the group including boron nitride, aluminum oxide, silicon carbide, aluminum nitride, magnesium oxide, and beryllium oxide.

24. A heat sink assembly comprising:
a printed circuit board including a first surface having at least one heat generating source, and a second, irregular surface having a plurality of protrusions from which heat is to be conducted:
a heat dispersing member;
means mounting said heat dispersing member proximate to said second surface of said printed circuit board;
an elastomeric member disposed between said second surface and said heat dispersing member; and
at least one of said heat dispersing member and said elastomeric member defining a plurality of voids at a junction thereof, each of said voids disposed along the junction between said elastomeric member and said heat dispersing member and said voids spaced with respect to each other and are aligned with said protrusions, said elastomeric member deformed by said protrusions and conformed to said irregular surface to enable said elastomeric member to be displaced into said voids by said irregular surface, to increase surface area of said elastomeric member that is in contact with said irregular surface and enhance thermal conductivity from said irregular surface to said heat dispersing member.

25. The heat sink assembly claim 24 in which said heat generating source includes at least one electronic component and said irregularities of said second surface include a plurality of leads of a said electronic component.

26. The heat sink assembly of claim 24 in which said voids are recesses established by periodic channels.

27. The heat sink assembly of claim 24 in which said elastomeric member is electrically insulative and thermally conductive.

28. The heat sink assembly of claim 27 in which said elastomeric member includes a silicone material and a thermally conductive filler from the group consisting of boron nitride, aluminum oxide, silicon carbide, aluminum nitride, magnesium oxide, and beryllium oxide.

* * * * *